(12) United States Patent
Suzawa

(10) Patent No.: US 9,806,198 B2
(45) Date of Patent: Oct. 31, 2017

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventor: Hideomi Suzawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/287,749

(22) Filed: May 27, 2014

(65) Prior Publication Data
US 2014/0361289 A1    Dec. 11, 2014

(30) Foreign Application Priority Data
Jun. 5, 2013 (JP) ................................. 2013-118730

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78618* (2013.01)

(58) Field of Classification Search
CPC ............................ H01L 29/242–29/245; H01L 29/7869–29/78693; H01L 2924/1067–2924/1068; H01L 29/66969
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Morosawa, N. et al., "High Mobility Self-Aligned Top-Gate Oxide TFT for High-Resolution AM-OLED," SID Digest '13: SID International Symposium Digest of Technical Papers, May 21, 2013, pp. 85-88.

(Continued)

*Primary Examiner* — Peniel M Gumedzoe
(74) *Attorney, Agent, or Firm* — Husch Blackwell LLP

(57) ABSTRACT

Objects are to obtain a minute transistor by reducing the channel length L of a transistor used in a semiconductor integrated circuit such as an LSI, a CPU, or a memory, increase the operation speed of the circuit, and reduce power consumption. Oxide layers having compositions different from the composition of an oxide semiconductor layer including a channel formation region are provided below and over the oxide semiconductor layer, and in the oxide semiconductor layer including the channel formation region, low-resistance regions are provided to interpose the channel formation region therebetween in the lateral direction. The low-resistance regions are formed in a region other than the channel formation region so as to be in contact with a metal film or a metal oxide film by diffusion of a metal element (e.g., aluminum) contained in the metal or metal oxide films into the parts of the oxide semiconductor layer.

11 Claims, 7 Drawing Sheets

(56) References Cited

U.S. PATENT DOCUMENTS

| | | |
|---|---|---|
| 6,184,556 B1 * | 2/2001 | Yamazaki ............ H01L 27/1203 257/219 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,384,080 B2 | 2/2013 | Taniguchi et al. |
| 8,502,216 B2 | 8/2013 | Akimoto et al. |
| 8,541,266 B2 | 9/2013 | Yamazaki |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 * | 3/2003 | Kawasaki ......... H01L 29/66969 257/350 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283055 A1 * | 11/2010 | Inoue et al. .................. 257/59 |
| 2011/0140108 A1 * | 6/2011 | Kimura ............... H01L 27/1225 257/57 |
| 2011/0175082 A1 * | 7/2011 | Kim .................... H01L 27/1225 257/43 |
| 2011/0309411 A1 | 12/2011 | Takemura |
| 2011/0312127 A1 | 12/2011 | Ishizuka et al. |
| 2012/0001167 A1 * | 1/2012 | Morosawa ........... H01L 29/7869 257/43 |
| 2012/0008367 A1 * | 1/2012 | Kajiyama ............ H01L 27/228 365/148 |
| 2012/0315730 A1 | 12/2012 | Koezuka et al. |
| 2012/0319183 A1 * | 12/2012 | Yamazaki ............ H01L 29/7782 257/288 |
| 2013/0009148 A1 | 1/2013 | Yamazaki |
| 2013/0015437 A1 * | 1/2013 | Yamazaki ............ H01L 27/1225 257/43 |
| 2013/0285019 A1 * | 10/2013 | Kim ...................... H01L 29/775 257/29 |
| 2014/0339544 A1 | 11/2014 | Hanaoka et al. |
| 2014/0339546 A1 | 11/2014 | Yamazaki et al. |
| 2014/0339560 A1 | 11/2014 | Yamazaki et al. |
| 2015/0129865 A1 * | 5/2015 | Miyamoto et al. .............. 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2011-124360 A | 6/2011 |

(56) References Cited

FOREIGN PATENT DOCUMENTS

| JP | 2011-138934 A | 7/2011 |
|---|---|---|
| JP | 2013-016782 A | 1/2013 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga-Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg ,Mn, Fe, Ni, Cu,or Zn] at Temperatures over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review. Letters), Jul. 31, 2000, vol. 85, No. 5, pp. 1012-1015.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a method for manufacturing the semiconductor device.

One embodiment of the present invention relates to a semiconductor device including a transistor or a semiconductor device including a circuit including the transistor. For example, one embodiment of the present invention relates to a semiconductor device including a transistor in which an oxide semiconductor is used for a channel formation region or a semiconductor device including a circuit that is formed with the use of such a transistor. For example, the present invention relates to an electronic device that includes, as a component, an LSI, a CPU, a power device mounted in a power circuit, a semiconductor integrated circuit including a memory, a thyristor, a converter, an image sensor, or the like, an electro-optical device typified by a liquid crystal display panel, or a light-emitting display device including a light-emitting element.

Note that in this specification, a semiconductor device refers to any device that can function by utilizing semiconductor characteristics, and an electro-optical device, a semiconductor circuit, and an electronic device are all included in the category of semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique by which a transistor is formed using zinc oxide or an In—Ga—Zn-based oxide semiconductor as an oxide semiconductor is disclosed (see Patent Document 1).

Patent Document 2 discloses a technique for forming, in an oxide semiconductor film, low-resistance regions that contain a metal element introduced by heat treatment performed with the oxide semiconductor film in contact with a film containing the metal element and contain a dopant introduced by an implantation method through the film containing the metal element.

REFERENCE

Patent Document

[Patent Document 1] Japanese Published Patent Application No. 2007-123861
[Patent Document 2] Japanese Published Patent Application No. 2013-16782

SUMMARY OF THE INVENTION

In recent years, semiconductor devices have been developed to be used mainly for an LSI, a CPU, or a memory. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

Objects are to obtain a minute transistor by reducing the channel length L of a transistor used in a semiconductor integrated circuit such as an LSI, a CPU, or a memory, increase the operation speed of the circuit, and reduce power consumption.

High integration of a semiconductor integrated circuit requires miniaturization of a transistor. However, it is known that miniaturization of a transistor causes deterioration or variations of electrical characteristics, such as on-state current, threshold voltage, and a subthreshold value (S value), of the transistor. This means that miniaturization of a transistor is likely to cause a decrease in yield of a semiconductor integrated circuit.

Thus, an object of one embodiment of the present invention is to provide a semiconductor device having a structure that can prevent a decrease in electrical characteristics, which becomes more significant with miniaturization of a transistor. Another object is to provide a semiconductor device having a structure with which a decrease in yield due to miniaturization can be suppressed. In addition, another object is to provide a highly integrated semiconductor device. Another object of one embodiment of the present invention is to provide a semiconductor device with high reliability. Another object is to provide a semiconductor device that can retain data even when power supply is stopped.

Means for Solving the Problems

In a semiconductor device of one embodiment of the present invention, oxide layers having compositions different from the composition of an oxide semiconductor layer including a channel formation region are provided below and over the oxide semiconductor layer, and in the oxide semiconductor layer including the channel formation region, low-resistance regions are provided to interpose the channel formation region therebetween in the lateral direction. For the channel formation region, an intrinsic or substantially intrinsic oxide semiconductor is preferably used. When the quality of parts of the intrinsic or substantially intrinsic oxide semiconductor is changed to form the low-resistance regions, contact resistance between a source electrode layer and the oxide semiconductor layer and contact resistance between a drain electrode layer and the oxide semiconductor layer can be reduced. The low-resistance regions are formed in a region other than the channel formation region so as to be in contact with a metal film or a metal oxide film by diffusion of a metal element (e.g., aluminum) contained in the metal or metal oxide film into the parts of the oxide semiconductor layer. Thus, the low-resistance regions have a composition different from the composition of the channel formation region and have conductivity higher than that of the channel formation region.

One embodiment of the present invention is a semiconductor device including a first oxide layer over a semiconductor substrate, an oxide semiconductor layer over the first oxide layer, a second oxide layer over the oxide semiconductor layer, an insulating layer over the second oxide layer, and a gate electrode layer over the insulating layer. The oxide semiconductor layer includes a channel for region overlapping with the gate electrode layer and low-resistance regions having a lower resistance than the channel formation region. The channel formation region has a composition different from the composition of the low-resistance regions.

The low-resistance regions can be formed in a self-aligned manner utilizing the gate electrode layer, can prevent deterioration of electrical characteristics of the transistor, and can suppress variations.

A protective insulating layer including an aluminum oxide film is preferably provided to surround three-dimensionally the channel formation region formed of the intrinsic or substantially intrinsic oxide semiconductor. The protective insulating layer including the aluminum oxide film is an insulating layer whose oxygen and hydrogen permeability is lower than that of an oxide semiconductor layer or an insulating layer such as a silicon oxide film or a silicon oxynitride film. That is, the protective insulating layer has a barrier property against oxygen and hydrogen. Thus, with the protective insulating layer including the aluminum oxide film, oxygen vacancies formed due to release of oxygen can be reduced in a channel region surrounded by the protective insulating layer and mixing of hydrogen or a hydrogen compound into the channel region can be inhibited.

Another embodiment of the present invention is a semiconductor device including a first protective insulating layer containing aluminum oxide over a semiconductor substrate; a first oxide layer over the first protective insulating layer; an oxide semiconductor layer over the first oxide layer; a second oxide layer over the oxide semiconductor layer; an insulating layer over the second oxide layer; a gate electrode layer over the insulating layer; and a second protective insulating layer containing aluminum oxide over the gate electrode layer. The oxide semiconductor layer includes a channel formation region overlapping with the gate electrode layer and low-resistance regions having a lower resistance than the channel formation region. The second protective insulating layer is in contact with side surfaces of the first oxide layer, side surfaces of the oxide semiconductor layer, and side surfaces of the second oxide layer. The second protective insulating layer includes a region in contact with the first protective insulating layer.

It is also one of the features of one embodiment of the present invention to use one of the protective insulating layers to form the low-resistance regions in a self-aligned manner utilizing the gate electrode layer.

One embodiment of the manufacturing method of the present invention is a method for manufacturing a semiconductor device that includes the following steps: forming a first protective insulating layer containing aluminum oxide over a semiconductor substrate; forming a first oxide layer over the first protective insulating layer; forming an oxide semiconductor layer over the first oxide layer; forming a second oxide layer over the oxide semiconductor layer; forming an insulating layer over the second oxide layer; forming a gate electrode layer over the insulating layer; removing parts of the second oxide layer using the gate electrode layer as a mask to expose parts of the oxide semiconductor layer; and forming a second protective insulating layer containing aluminum oxide in contact with the parts of the oxide semiconductor layer to make the parts of the oxide semiconductor layer serve as low-resistance regions.

A method for forming the second protective insulating layer containing aluminum oxide is not particularly limited as long as during or after the formation of the second protective insulating layer, low-resistance regions can be formed in parts of the oxide semiconductor layer that is in contact with the second protective insulating layer containing aluminum oxide. For example, the second protective insulating layer containing aluminum oxide may be formed in such a manner that heat treatment is performed at 150° C. or higher in an atmosphere containing oxygen after an aluminum film is formed. In that case, the aluminum film is preferably formed thin, or the heat treatment is performed for a long time, so that the aluminum film is entirely insulated to be an aluminum oxide film. Alternatively, the second protective insulating layer containing aluminum oxide may be formed in such a manner that deposition is performed using an aluminum target in an atmosphere containing oxygen while the substrate is further heated; in this case, the step for heat treatment can be shortened, which is preferable.

The oxide semiconductor layer is formed using an In—M—Zn oxide (M is Al, Ti, Ga, Y, Zr, Sn, La, Ce, Nd, or Hf). The oxide semiconductor layer can be formed using, for example, an In—Ga—Zn oxide target including polycrystal having an atomic ratio of In:Ga:Zn=1:1:1, 5:5:6, 3:1:2, or the like.

The oxide semiconductor layer is preferably a non-single-crystal oxide semiconductor film and a film having high crystallinity. The oxide semiconductor layer is preferably a c-axis aligned crystalline oxide semiconductor (CAAC-OS) film.

First, a CAAC-OS film is described.

The CAAC-OS film is one of oxide semiconductor films having a plurality of c-axis aligned crystal parts.

A combined analysis image (high-resolution TEM image) of a bright-field image and a diffraction pattern of the CAAC-OS film is observed with a transmission electron microscope (TEM). Consequently, a plurality of crystal parts can be clearly observed. Even in the high-resolution TEM image, however, a boundary between crystal parts, that is, a grain boundary is not clearly observed. Thus, in the CAAC-OS film, a reduction in electron mobility due to the crystal grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm² or more, 5 µm² or more, or 1000 µm² or more is observed in some cases in the high-resolution plan-view TEM image.

A CAAC-OS film is subjected to structural analysis with an X-ray diffraction (XRD) apparatus. For example, when the CAAC-OS film including an InGaZnO₄ crystal is analyzed by an out-of-plane method, a peak appears frequently when the diffraction angle (2θ) is around 31°. This peak is derived from the (009) plane of the InGaZnO₄ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO₄ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO₄, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of the top surface of the CAAC-OS film. Thus, for example, in the case where a shape of the CAAC-OS film is changed by etching or the like, the c-axis might not be necessarily parallel to a normal vector of a formation surface or a normal vector of the top surface of the CAAC-OS film.

Further, distribution of c-axis aligned crystal parts in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO₄ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variations in the electrical characteristics of the transistor due to irradiation with visible light or ultraviolet light are small.

It is preferable that the first and second oxide layers be each formed using an In—M—Zn oxide (M is Al, Ti, Ga, Y, Zr, Sn, La, Ce, Nd, or Hf), and that an atomic ratio of M to In in each of the first and second oxide layers be higher than that in the oxide semiconductor layer.

For example, the first and second oxide layers can be formed using an In—Ga—Zn oxide target including polycrystal having an atomic ratio of In:Ga:Zn=1:3:2, 1:3:3, 1:3:4, 1:3:6, 1:6:4, or 1:9:6. The In—Ga—Zn oxide target including polycrystal contains at least an indium-gallium alloy and is baked at heat treatment of 1000° C. or higher.

In this specification and the like, a channel length means a length of a channel formation region in a direction in which carriers flow. A channel width means a length of the channel formation region, which is perpendicular to a channel length direction. A miniaturized transistor refers to a transistor that has a channel length (or a channel width) of, for example, 1 µm or less, preferably 100 nm or less, more preferably 40 nm or less, still more preferably 20 nm or less.

In this specification and the like, in the case of the substantially intrinsic oxide semiconductor layer, the carrier density thereof is lower than $1 \times 10^{17}/cm^3$, lower than $1 \times 10^{15}/cm^3$, or lower than $1 \times 10^{13}/cm^3$. With a highly purified intrinsic oxide semiconductor layer, the transistor can have stable electrical characteristics.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

According to one embodiment of the present invention, a semiconductor device can be provided in which deterioration of electrical characteristics that becomes more noticeable as the transistor is miniaturized can be suppressed. Alternatively, a semiconductor device having a structure that can prevent a decrease in yield caused by miniaturization can be provided. Further, a highly integrated semiconductor device can be provided. Another object is to provide a semiconductor device in which deterioration of on-state current characteristics is reduced. Alternatively, a semiconductor device with low power consumption can be provided. Furthermore, a highly reliable semiconductor device can be provided. Alternatively, a semiconductor device in which data is retained even when not powered can be provided.

DETAILED DESCRIPTION OF THE INVENTION

Embodiments of the present invention are described below in detail with reference to the drawings. However, the present invention is not limited to the description below, and it is easily understood by those skilled in the art that modes and details disclosed herein can be modified in various ways. Further, the present invention is not construed as being limited to description of the embodiments and the examples.

Embodiment 1

In this embodiment, a semiconductor device that is one embodiment of the present invention is described with reference to drawings.

Figure 1A:
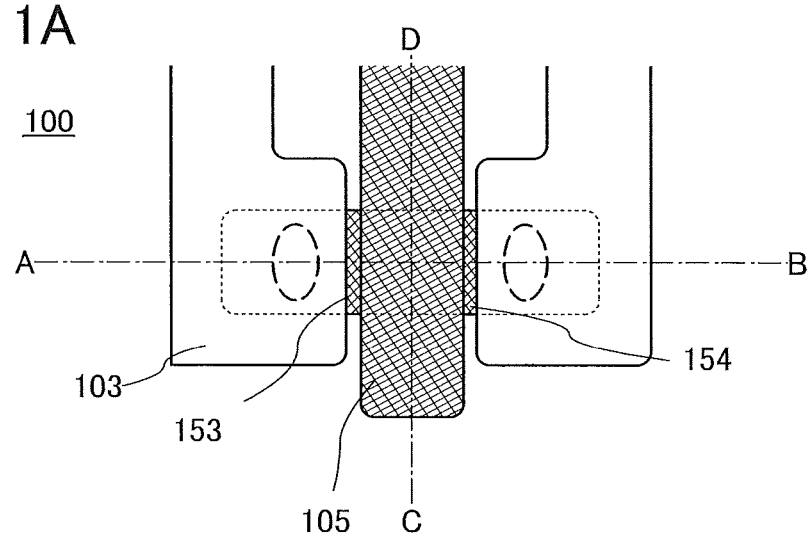
FIGS. 1A to 1C are a top view and cross-sectional views illustrating one embodiment of the present invention.
Figure 1B:
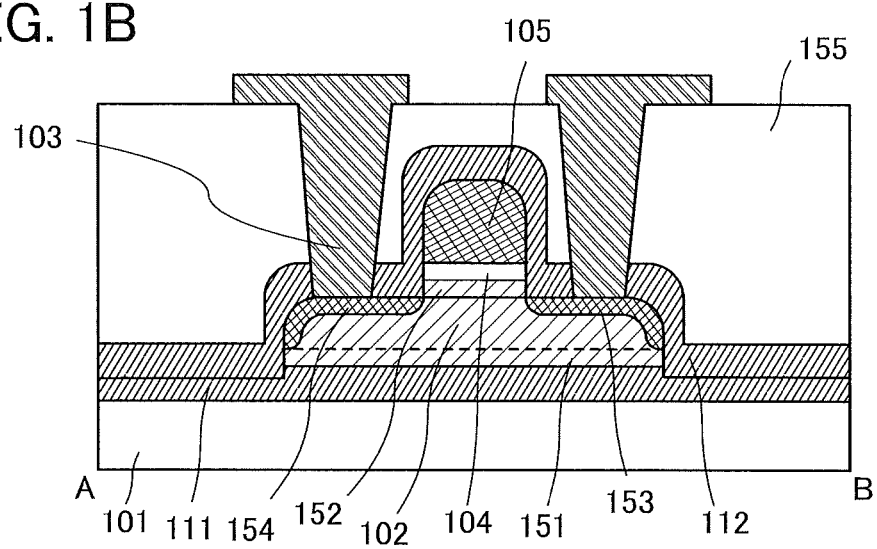
Figure 1C:
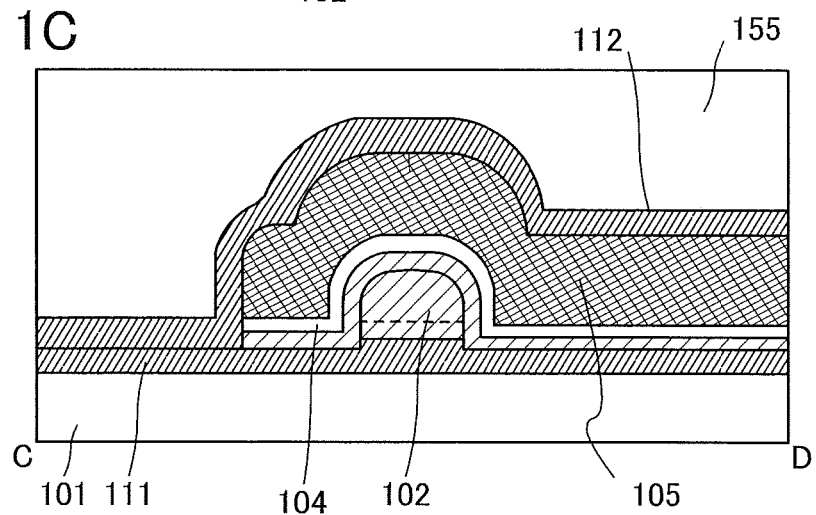

FIGS. 1A to 1C are a top view and cross-sectional views that illustrate a transistor of one embodiment of the present invention. FIG. 1A is the top view. FIG. 1B illustrates a cross section taken along the dashed-dotted line A-B in FIG. 1A.

FIG. 1C illustrates a cross section taken along the dashed-dotted line C-D in FIG. 1A. Note that for simplification of the drawing, some components in the top view in FIG. 1A are not illustrated. In some cases, the direction of the dashed-dotted line A-B is referred to as a channel length direction, and the direction of the dashed-dotted line C-D is referred to as a channel width direction.

A transistor 100 is formed over a semiconductor substrate 101, and includes a first oxide layer 151; an oxide semiconductor layer 102 including a channel formation region over the first oxide layer 151; low-resistance regions 153 and 154 in contact with the oxide semiconductor layer 102; a second oxide layer 152 over the oxide semiconductor layer 102; a gate insulating layer 104 overlapping with the oxide semiconductor layer 102; a gate electrode 105 that is over the gate insulating layer 104 and overlaps with the first oxide layer 151, the oxide semiconductor layer 102, and the second oxide layer 152; and a pair of electrodes 103 electrically connected to the low-resistance regions 153 and 154.

A first protective insulating layer 111 is provided between the semiconductor substrate 101 and the oxide semiconductor layer 102. A second protective insulating layer 112 is provided over the gate electrode 105. The second protective insulating layer 112 is in contact with the low-resistance regions 153 and 154. The second protective insulating layer 112 is further in contact with the first protective insulating layer 111 in a region where the oxide semiconductor layer 102 is not provided. The second protective insulating layer 112 is in contact with side surfaces of the first oxide layer 151 and side surfaces of the second oxide layer 152.

The oxide semiconductor layer 102 preferably contains at least indium (In) or zinc (Zn). Alternatively, both In and Zn are preferably contained. The oxide semiconductor layer 102 more preferably contains an In—M—Zn-based oxide (M is a metal such as Al, Ti, Ga, Y, Zr, Sn, La, Ce, or Hf).

Each of the first protective insulating layer 111 and the second protective insulating layer 112 can be formed using an insulating material including an oxygen-excess region and having a function of inhibiting diffusion of oxygen (also referred to as a property of blocking oxygen). For example, aluminum oxide, aluminum oxynitride, yttrium oxide, yttrium oxynitride, hafnium oxide, hafnium oxynitride, or the like is used.

It is preferable to use an insulating material having an extremely low hydrogen content for the first protective insulating layer 111 and the second protective insulating layer 112. For example, an insulating material including a region in which a hydrogen content measured by secondary ion mass spectrometry (SIMS) is less than $5 \times 10^{21}$ atoms/cm$^3$, preferably less than $2 \times 10^{21}$ atoms/cm$^3$, more preferably less than $1 \times 10^{21}$ atoms/cm$^3$ can be used.

Alternatively, a material in which silicon oxide is contained in any of the above-described oxides can be used as the insulating material for the first protective insulating layer 111 and the second protective insulating layer 112. For example, a material in which 0.1 wt % to 30 wt % (e.g., 5 wt % or 10 wt %) silicon oxide is contained in aluminum oxide can be used. The use of the material containing 0.1 wt % to 30 wt % silicon oxide can increase the amount of oxygen released by heating without decreasing the property of blocking oxygen and can reduce the stress of a film.

One of the pair of electrodes 103 serves as a source electrode and the other serves as a drain electrode of the transistor 100. In FIGS. 1A to 1C, the pair of electrodes 103 are electrically connected to the low-resistance regions 153 and 154 through contact holes formed in an interlayer insulating layer 155. The low-resistance regions 153 and 154 have a composition different from the composition of the channel formation region.

The low-resistance regions 153 and 154 are formed so that the channel formation region is positioned between the low-resistance regions in the channel length direction, whereby on-state characteristics (e.g., on-state current or field-effect mobility) of the transistor 100 can be improved and thus high speed operation can be performed.

As illustrated in FIG. 1C, the gate electrode 105 is provided to surround the top surface and side surfaces of the oxide semiconductor layer 102 with the gate insulating layer 104 provided therebetween.

Here, the channel length L of the transistor 100 corresponds to a width of the gate electrode and is substantially the same as a distance between the source and the drain that face each other. The channel width W of the transistor 100 is the width of the oxide semiconductor layer 102 in a direction orthogonal to the channel length direction. Note that in the transistor, depending on the top shapes of the source electrode, the drain electrode, the gate electrode, and the oxide semiconductor layer, the channel length and the channel width are not uniform in some cases. In such a case, the average channel length or the minimum channel length can be used as the channel length of the transistor, and the average channel width or the minimum channel width can be used as the channel width of the transistor.

As illustrated in FIG. 1C, the gate electrode 105 is provided to surround also the side surfaces of the oxide semiconductor layer 102; therefore, the side surfaces of the oxide semiconductor layer 102 can serve as a channel formation region. In this case, the thickness of the oxide semiconductor layer 102 is preferably 0.05 times or more and 20 times or less, more preferably 0.1 times or more and 10 times or less as large as the channel width of the oxide semiconductor layer 102. With such a shape, a decrease in an on-state current can be suppressed even when the channel width is reduced, resulting in a further miniaturized transistor capable of operating at high speed.

Figure 6A:
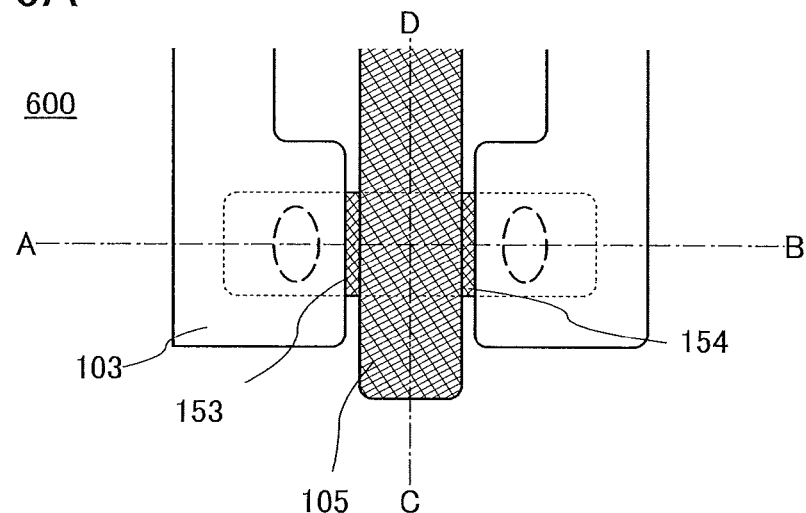
FIGS. 6A to 6C are a top view and cross-sectional views illustrating one embodiment of the present invention.
Figure 6B:
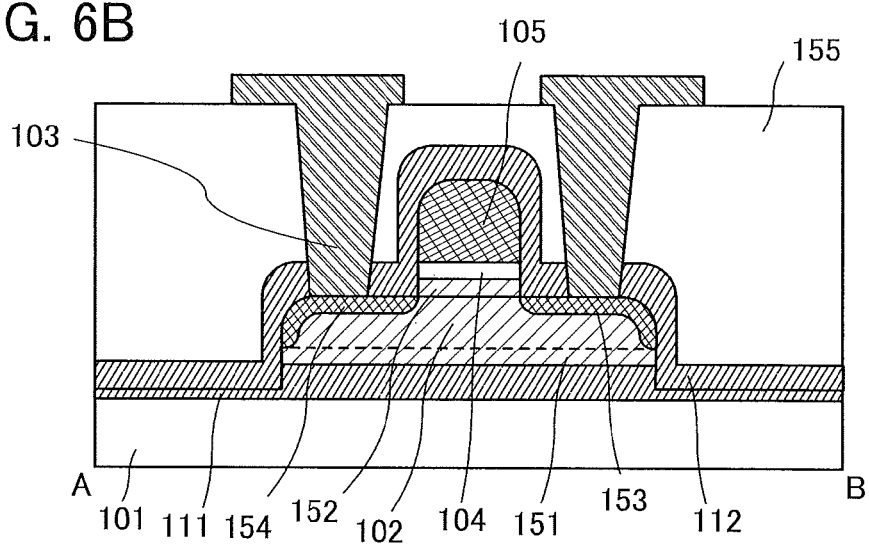
Figure 6C:
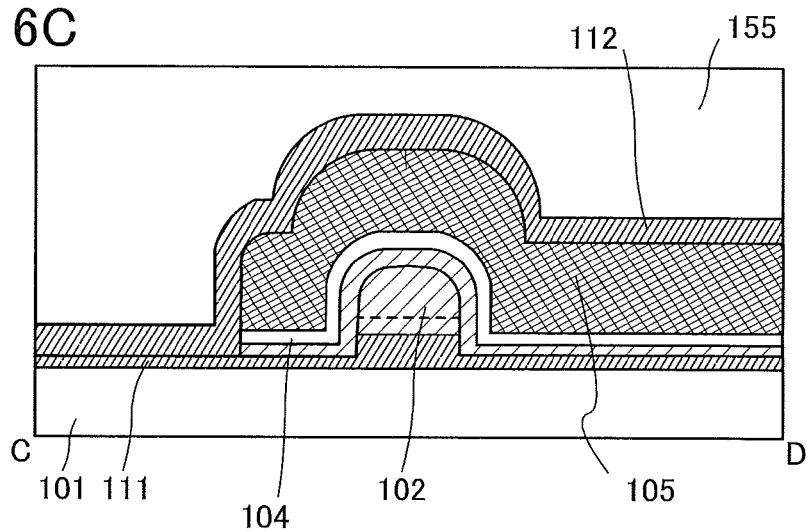

A structure of such a transistor in which a gate electrode is provided to surround the top surface and side surfaces of an oxide semiconductor layer and a channel formed in the vicinity of the side surfaces of the oxide semiconductor layer is actively used to increase an on-state current can be referred to as a surrounded channel (S-channel) structure. FIGS. 6A to 6C illustrate an example of an S-channel structure that is partly different from that in FIGS. 1A to 1C. The top view of a transistor 600 in FIG. 6A is the same as that of the transistor 100 in FIG. 1A. In a cross section illustrated in FIG. 6B, the thickness of the first protective insulating layer 111 is smaller than that of the first protective insulating layer 111 illustrated in FIG. 1B. Also in a cross section illustrated in FIG. 6C, the thickness of the first protective insulating layer 111 is smaller than that of the first protective insulating layer 111 illustrated in FIG. 1C. Thus, in the transistor 600 illustrated in FIG. 6A, the gate electrode 105 is formed to surround the top and side surfaces of the oxide semiconductor layer 102, whereby on-state current is increased.

Here, a band structure of the channel formation region in the transistor 100 is described.

Figure 2A:
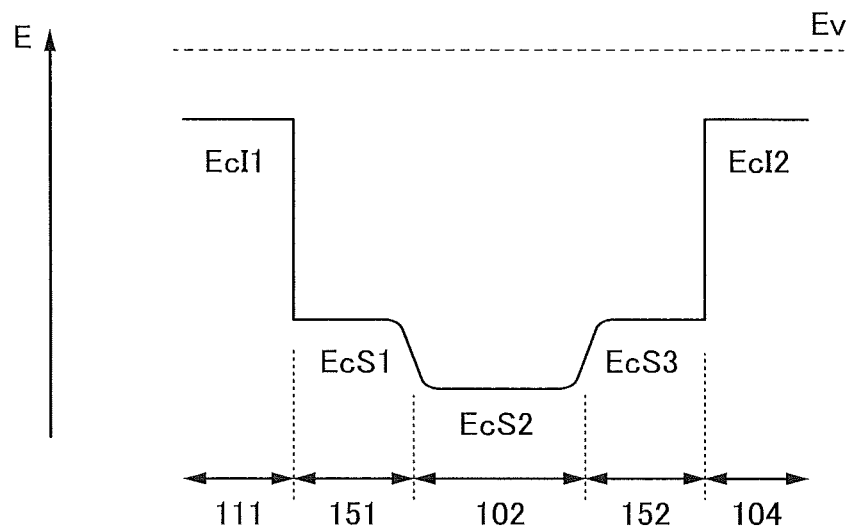
FIGS. 2A and 2B each show a band diagram of an embodiment.
Figure 2B:
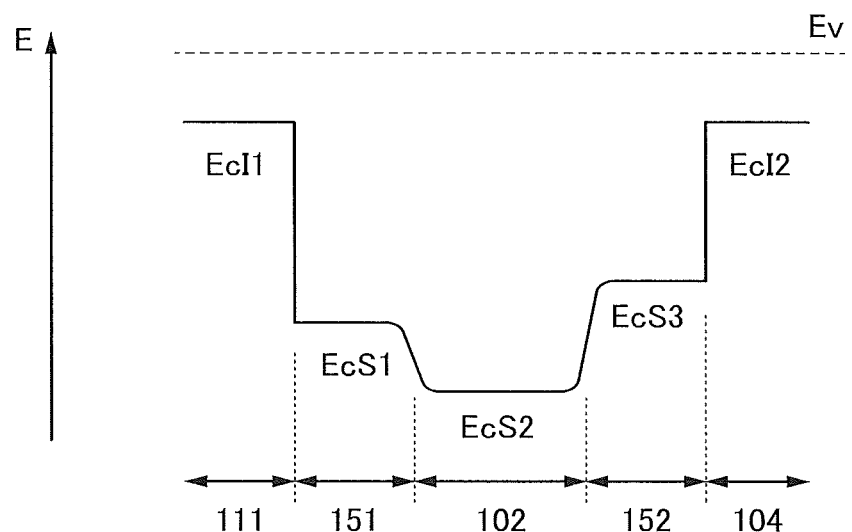

FIGS. 2A and 2B each schematically illustrate an energy band structure of the channel formation region in the thickness direction.

In FIGS. 2A and 2B, EcI1, EcS1, EcS2, EcS3, EcI2 schematically represent energies at the conduction band minimum of the first protective insulating layer 111, the first oxide layer 151, the oxide semiconductor layer 102, the second oxide layer 152, and the gate insulating layer 104, respectively. Note that the thicknesses of the layers are not considered here for convenience.

Here, an energy difference between the vacuum level and the conduction band minimum (the difference is also referred to as electron affinity) corresponds to a value obtained by subtracting an energy gap from an energy difference between the vacuum level and the valence band maximum (the difference is also referred to as an ionization potential). Note that the energy gap can be measured using a spectroscopic ellipsometer (e.g., UT-300 manufactured by HORIBA JOBIN YVON S.A.S.). Note that the energy difference between the vacuum level and the valence band maximum can be measured using an ultraviolet photoelectron spectroscopy (UPS) device (e.g., VersaProbe manufactured by ULVAC-PHI, Inc.).

As shown in FIG. 2A, energy at the conduction band minimum continuously changes from the first oxide layer 151 through the oxide semiconductor layer 102 to the second oxide layer 152, without an energy barrier therebetween. This is because oxygen is easily diffused between the first oxide layer 151 and the oxide semiconductor layer 102, and between the oxide semiconductor layer 102 and the second oxide layer 152 since these layers have similar compositions, and thus a layer that can be called a mixed layer is formed.

Note that although the case where the first oxide layer 151 and the second oxide layer 152 are oxide layers having the same energy gap is shown in FIG. 2A, the first and second oxide layers may be oxide layers having different energy gaps. For example, FIG. 2B shows part of the band structure in which EcS3 is higher than EcS1. Although not shown, EcS1 may be higher than EcS3.

FIGS. 2A and 2B show that in the channel formation region, the oxide semiconductor layer 102 serves as a well and a channel is formed in the oxide semiconductor layer 102. Note that since the energies at the conduction band minimum are changed continuously, the first oxide layer 151, the oxide semiconductor layer 102, and the second oxide layer 152 can also be referred to as U-shaped wells. Further, a channel formed to have such a structure can also be referred to as a buried channel.

The first oxide layer 151 and the second oxide layer 152 are oxides that contain one or more of the metal elements contained in the oxide semiconductor layer 102; therefore, a stacked-layer structure in which the first oxide layer 151, the oxide semiconductor layer 102, and the second oxide layer 152 are stacked can also be referred to as an oxide stack including layers having the same main component (hereinafter, the stacked-layer structure in which the first oxide layer 151, the oxide semiconductor layer 102, and the second oxide layer 152 are stacked is also referred to as an oxide stack). The oxide stack including the layers having the same main component is formed not simply by stacking layers but to have a continuous junction (here, in particular, a U-shaped well structure in which energy of the conduction band minimum is changed continuously between the layers). This is because when impurities that form a defect state such as a trap center or a recombination center are mixed at an interface between the layers, the continuity of the energy band is lost, and thus carriers are trapped or disappear by recombination at the interface.

To form a continuous junction, the layers are preferably stacked successively without exposure to the air with use of a multi-chamber deposition apparatus (e.g., a sputtering apparatus) including a load lock chamber. Each chamber in the sputtering apparatus is preferably evacuated to high vacuum (approximately $5\times10^{-7}$ Pa to $1\times10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

Not only high vacuum evacuation in a chamber but also high purity of a sputtering gas is necessary to obtain a high-purity intrinsic oxide semiconductor. When a highly purified gas having a dew point of $-40°$ C. or lower, preferably $-80°$ C. or lower, more preferably $-100°$ C. or lower is used as an oxygen gas or an argon gas used as a sputtering gas, moisture or the like can be prevented from entering an oxide semiconductor as much as possible.

The first oxide layer 151 under the oxide semiconductor layer 102 and the second oxide layer 152 over the oxide semiconductor layer 102 can function as barrier layers to inhibit the influence of a trap state, which is formed at the interface between the oxide stack and the insulating layer (the first protective insulating layer 111 and the gate insulating layer 104) in contact with the oxide stack, on the oxide semiconductor layer 102 that serves as the main carrier path in the transistor.

For example, oxygen vacancies contained in the semiconductor layer appear as localized states in deep energy area in the energy gap of the oxide semiconductor. A carrier is trapped in such localized states, so that reliability of the transistor is lowered. For this reason, oxygen vacancies contained in the semiconductor layer should be reduced. In the oxide stack, the oxide layers in which oxygen vacancies are less likely to be generated than in the oxide semiconductor layer 102 are provided on and under the oxide semiconductor layer 102 so as to be in contact with the oxide semiconductor layer 102, whereby oxygen vacancies in the oxide semiconductor layer 102 can be reduced. For example, in the oxide semiconductor layer 102, the absorption coefficient due to the localized levels, which is obtained by measurement by a constant photocurrent method (CPM) is set lower than $1\times10^{-3}$/cm, preferably lower than $1\times10^{-4}$/cm.

In addition, when the oxide semiconductor layer 102 is in contact with an insulating layer including a different constituent element (e.g., an insulating layer including a silicon oxide film), an interface state is sometimes formed at the interface of the two layers and the interface state forms a channel. At this time, a second transistor having a different threshold voltage appears, so that an apparent threshold voltage of the transistor is varied. However, since the first oxide layer 151 contains one or more metal elements forming the oxide semiconductor layer 102 in the oxide stack, an interface state is less likely to be formed at the interface between the first oxide layer 151 and the oxide semiconductor layer 102. Thus, the formation of the first oxide layer 151 makes it possible to reduce fluctuation in the electrical characteristics of the transistor, such as threshold voltage.

When a channel is formed at the interface between the gate insulating layer 104 and the oxide semiconductor layer 102, interface scattering occurs at the interface and the field-effect mobility of the transistor is reduced. However, since the second oxide layer 152 contains one or more metal elements faulting the oxide semiconductor layer 102 in the oxide stack, scattering of carriers is less likely to occur at the interface between the second oxide layer 152 and the oxide semiconductor layer 102, and thus the field-effect mobility of the transistor can be increased.

Embodiment 2

In this embodiment, an example of a method for manufacturing the transistor 100 described in Embodiment 1 is described below.

First, the first protective insulating layer 111 is formed over the semiconductor substrate 101.

The first protective insulating layer 111 can be formed by a sputtering method or the like in an atmosphere containing oxygen, for example. Alternatively, the first protective insulating layer 111 may be formed by a CVD method, a molecular beam epitaxy (MBE) method, an atomic layer deposition (ALD) method, a pulsed laser deposition (PLD) method, or the like in an atmosphere containing oxygen.

In the case where an aluminum oxide film is used as the first protective insulating layer 111, for example, the first protective insulating layer 111 can be formed in an atmosphere containing oxygen with the use of aluminum oxide as a sputtering target. Note that an inert gas such as a rare gas may be contained in a deposition gas. For example, oxygen is preferably contained in the deposition gas so that the flow rate of the oxygen accounts for 20% or higher, preferably 30% or higher, more preferably 40% or higher of that of the deposition gas. Note that although the aluminum oxide film may be formed by a reactive sputtering method with the use of aluminum as a sputtering target, aluminum oxide is preferably used as the sputtering target because oxygen can be further contained in the film.

Figure 3A:
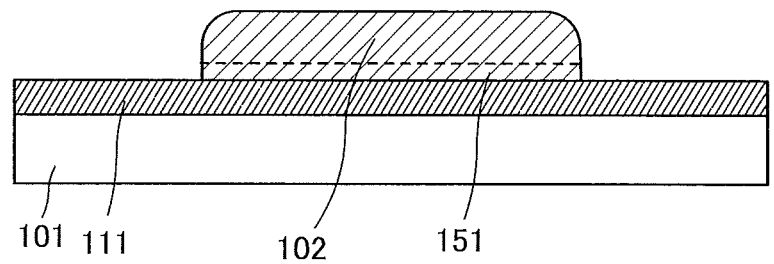
FIGS. 3A to 3C are cross-sectional views illustrating a manufacturing process of one embodiment of the present invention.

Next, a first oxide film and an oxide semiconductor film are formed over the first protective insulating layer 111. A resist mask is formed over the oxide semiconductor film by a photolithography method or the like and unnecessary portions of the first oxide film and the oxide semiconductor film are etched. Then, the resist mask is removed. Thus, the island-shaped first oxide layer 151 and the island-shaped oxide semiconductor layer 102 can be formed (FIG. 3A).

Before the first oxide film is formed, an insulating layer including an oxygen-excess region may be provided over the first protective insulating layer 111. In that case, when the insulating layer including the oxygen-excess region (e.g., a silicon oxide film) is positioned between the first protective insulating layer 111 and the island-shaped first oxide layer 151 and oxygen in the silicon oxide film is supplied to the island-shaped oxide semiconductor layer 102 in later heat treatment, oxygen vacancies in the island-shaped oxide semiconductor layer 102 can be preferably reduced.

The first oxide film and the oxide semiconductor film can be formed by a sputtering method, a CVD method, an MBE method, an ALD method, a PLD method, or the like. Alternatively, a technique for formation of a thin film using a liquid material, such as a sol-gel method, a spray method, or a mist method, can be used. The first oxide film and the oxide semiconductor film are preferably formed by a sputtering method. As the sputtering method, an RF sputtering method, a DC sputtering method, an AC sputtering method, or the like can be used. In particular, a DC sputtering method is preferably used because dust generated in the film formation can be reduced and the film thickness can be uniform.

Note that heat treatment may be performed after the formation of the oxide semiconductor film. The heat treatment may be performed at $250°$ C. or higher and $650°$ C. or lower, preferably $300°$ C. or higher and $500°$ C. or lower in an inert gas atmosphere, in an atmosphere containing an oxidization gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the first protective insulating layer 111 to the oxide semiconductor film (or the oxide semiconductor layer 102), which enables a reduction in oxygen vacancies in the oxide semiconductor included in the oxide semiconductor layer 102. Note that the heat treatment may be performed directly after the formation of the oxide semiconductor film or may be performed after the oxide semiconductor film is processed into the island-shaped oxide semiconductor layer 102.

As light used to form the resist mask, for example, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning a beam such as an electron beam, a photomask is not needed.

Furthermore, as illustrated in the cross section of FIG. 3A, the oxide semiconductor layer 102 is preferably processed so that the upper corners thereof are smoothly curved. Such a shape tends to be obtained particularly in the case where the oxide semiconductor layer 102 is finely processed. The oxide semiconductor layer 102 with such a cross-sectional shape is preferable because the coverage with a film formed thereover is increased and thus variations and a change in the electrical characteristics of the transistor 100 can be suppressed.

Figure 3B:
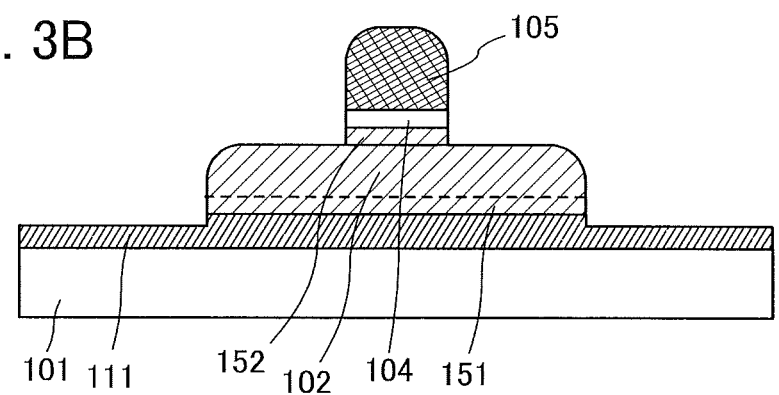

Next, a second oxide film, an insulating film, and a conductive film are formed in this order. After that, a resist mask is formed over the conductive film by a photolithography method or the like and the second oxide film, the insulating film, and the conductive film are selectively etched and removed. By this etching, part of the oxide semiconductor layer 102 is exposed. Specifically, a region of the oxide semiconductor layer 102 other than the channel formation region is exposed. Then, the resist mask is removed. Thus, the gate electrode 105, the gate insulating layer 104, and the second oxide layer 152 can be formed (FIG. 3B).

The second oxide film can be formed by a sputtering method, a CVD method, an MBE method, an ALD method, a PLD method, or the like. Alternatively, a technique for forming a thin film using a liquid material, such as a sol-gel method, a spray method, or a mist method, can be used. The second oxide film is preferably formed by a sputtering method.

The insulating film serving as the gate insulating layer 104 can be formed by a sputtering method, a CVD method, an MBE method, an ALD method, a PLD method, or the like. In particular, it is preferable that the insulating film be formed by a CVD method, further preferably a plasma CVD method because coverage can be improved. The gate insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like. Alternatively, the gate insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAlO$_x$N$_z$), hafnium oxide, or yttrium oxide, in which case gate leakage current of the transistor can be reduced.

The gate electrode 105 can be formed by a sputtering method, an evaporation method, a CVD method, or the like, for example.

Note that in this embodiment, to shorten the process, the gate insulating layer 104 is etched at the same time when the gate electrode 105 is formed, so that the gate insulating layer 104 is processed to have a shape similar to that of the gate electrode 105 when seen from above. However, the gate insulating layer 104 and the gate electrode 105 may be processed individually so that the gate insulating layer 104 extends beyond the outside of the gate electrode 105. Note that in the case of performing exposure by scanning a beam such as an electron beam, a photomask is not needed.

Figure 3C:
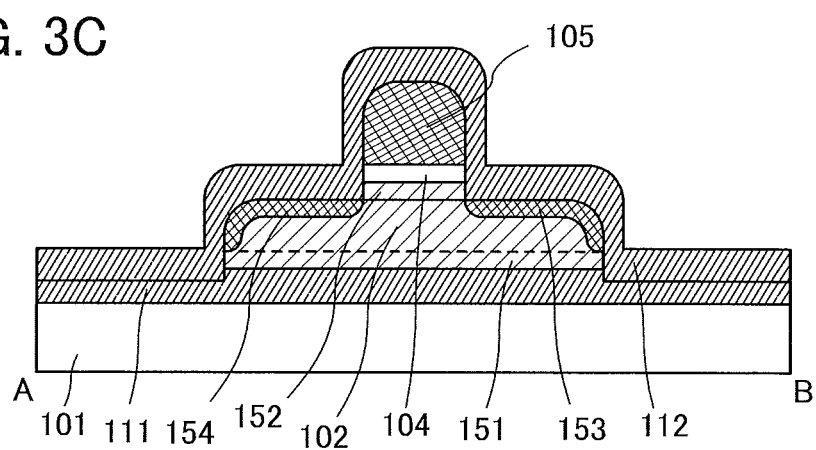

Then, the second protective insulating layer 112 is formed (FIG. 3C).

In this embodiment, after a metal film is formed, heat treatment is performed to oxidize the metal film, so that the second protective insulating layer 112 is formed. Metal elements contained in the metal film are diffused to part of the oxide semiconductor layer 102 at the time of this heat treatment, whereby the low-resistance regions 153 and 154 are formed in a self-aligned manner utilizing the gate electrode 105. For example, an aluminum oxide film is formed in such a manner that an aluminum film is formed using an aluminum target in an inert atmosphere and then heat treatment is performed in an oxygen atmosphere at a temperature of 150° C. or higher.

Alternatively, an aluminum oxide film may be formed using an aluminum target in an oxygen atmosphere by a reactive sputtering method while the substrate temperature is set to 150° C. or higher, preferably 250° C. or higher. In that case, aluminum elements are diffused to part of the oxide semiconductor layer 102 during the deposition, whereby the low-resistance regions 153 and 154 are formed in a self-aligned manner utilizing the gate electrode 105. Thus, the low-resistance regions 153 and 154 contain aluminum elements and have lower resistances than the channel formation region below the gate electrode 105. Also, the low-resistance regions 153 and 154 have a composition different from the composition of the channel formation region.

It is preferable to prevent entry of moisture or the like into the oxide semiconductor layer as much as possible with the use of a highly purified gas (oxygen, ozone, or argon) having a dew point of −40° C. or lower, preferably −80° C. or lower, still preferably −100° C. or lower as a gas used in an atmosphere for forming the second protective insulating layer 112 by a sputtering method. The reduction of concentration of impurities such as hydrogen inside an oxide semiconductor layer and in the vicinity of the interface of the oxide semiconductor layer enables stable electrical characteristics of a transistor.

For the aluminum film, an ALD method may be used as well as a sputtering method. In the case of using an ALD method, trimethylaluminum (TMA; (CH$_3$)$_3$Al) may be used as the source gas.

As illustrated in FIG. 3C, the second protective insulating layer 112 is provided in contact with the first protective insulating layer 111 in a region where the oxide semiconductor layer 102 is not provided. That is, the first protective insulating layer 111 and the second protective insulating layer 112 can surround the oxide semiconductor layer 102; accordingly, release of oxygen from the oxide semiconductor layer can be suppressed, whereby generation of oxygen vacancies is suppressed.

Then, the interlayer insulating layer 155 is formed and contact holes reaching the low-resistance regions 153 and 154 are formed. After that, a conductive film is formed. This conductive film is selectively etched to form the pair of electrodes 103.

The interlayer insulating layer 155 may be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like. Planarization treatment such as CMP may be performed after the formation.

The pair of electrodes 103 can be formed to have a single-layer structure or a stacked-layer structure using, as a conductive material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which a titanium film is stacked over an aluminum film, a two-layer structure in which a copper film is stacked over a titanium film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Through the above steps, the transistor 100 can be manufactured. With the structure of the transistor 100 including the first oxide layer below the oxide semiconductor layer and the second oxide layer over the oxide semiconductor layer, the threshold voltage can be stabilized and the S value can be reduced. Thus, Icut (current when gate voltage VG is 0 V) can be reduced and power consumption of the semiconductor device can be reduced. Further, the threshold voltage of the transistor becomes stable; thus, long-term reliability of the semiconductor device can be improved.

In the transistor 100, the channel formation region is not in contact with the gate insulating film. Accordingly, scattering of carriers at the interface between the channel formation layer and the gate insulating film can be reduced and the field-effect mobility of the transistor can be increased.

Figure 7:
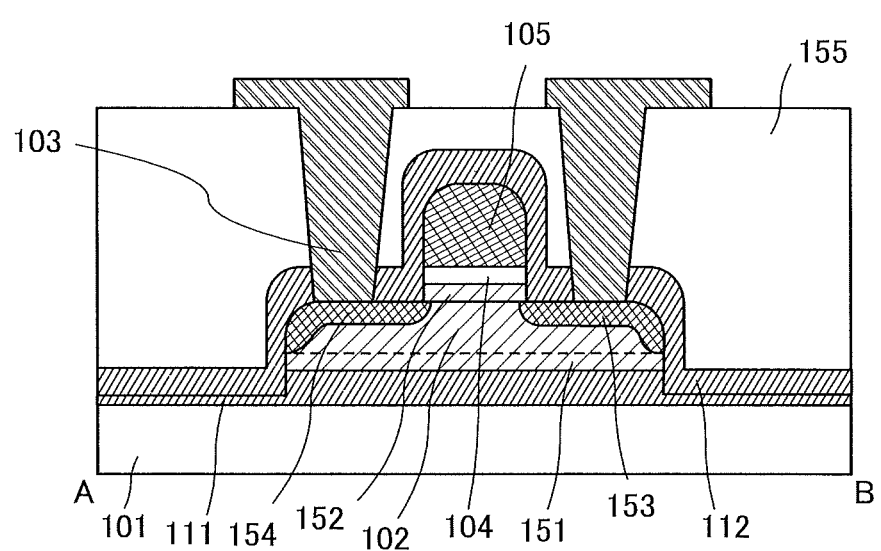
FIG. 7 is a cross-sectional view illustrating one embodiment of the present invention.

The transistor 100 includes the self-aligned low-resistance regions adjacent to the channel formation region, and therefore can obtain sufficiently high on-state current even in the case where the transistor is miniaturized. Since the low-resistance regions 153 and 154 are formed by diffusion of a metal element contained in a metal film into part of the oxide semiconductor layer 102 at the time of heat treatment, the low-resistance regions 153 and 154 are overlapped with the gate electrode in some cases depending on the heating conditions (e.g., temperature or time) and the metal element. An example of such a case is illustrated in FIG. 7. In the transistor illustrated in FIG. 7, the channel length corresponds to the minimum distance between the low-resistance regions 153 and 154. In the case where the low-resistance regions 153 and 154 are overlapped with the gate electrode, high on-state current can be obtained.

The transistor 100 may have a structure in which a conductive film is provided between the oxide semiconductor layer 102 and the semiconductor substrate 101. When the conductive film is used as a second gate electrode, the on-state current can be further increased and the threshold voltage can be controlled. In order to increase the on-state current, for example, the gate electrode 105 and the conductive film (second gate electrode) are set to have the same potential, and the transistor is driven as a dual-gate transistor. Further, to control the threshold voltage, a fixed potential, which is different from a potential of the gate electrode 105, is supplied to the conductive film (second gate electrode).

This embodiment can be combined with any of the other embodiments disclosed in this specification as appropriate.

Embodiment 3

In this embodiment, an example of a semiconductor device (storage device) that includes the transistor of one embodiment of the present invention, that can retain stored data even when not powered, and that has an unlimited number of write cycles is described with reference to drawings.

Figure 4A:
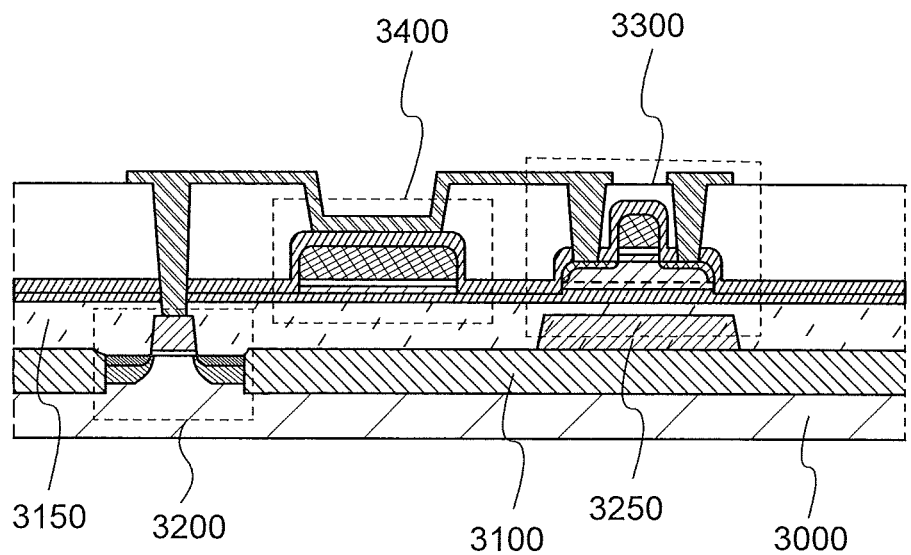
FIGS. 4A and 4B are a cross-sectional view and a circuit diagram of a semiconductor device.
Figure 4B:
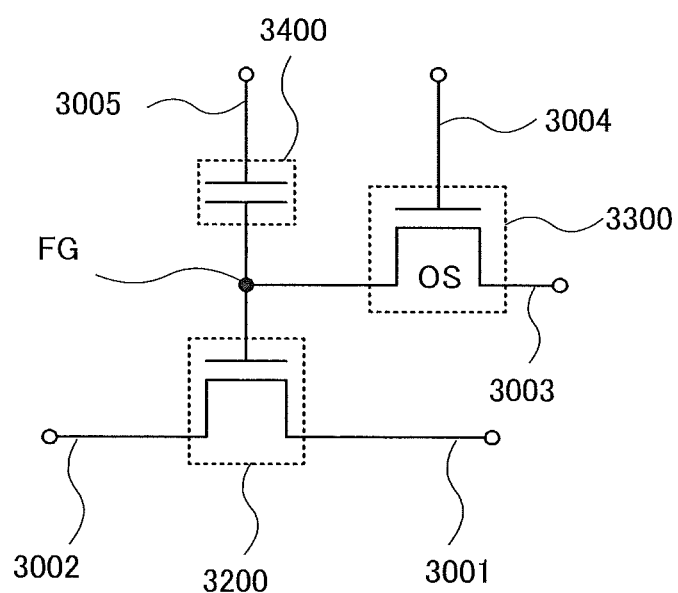

FIG. 4A is a cross-sectional view of the semiconductor device, and FIG. 4B is a circuit diagram of the semiconductor device.

The semiconductor device illustrated in FIGS. 4A and 4B includes a transistor 3200 including a first semiconductor material in a lower portion, and a transistor 3300 including a second semiconductor material and a capacitor 3400 in an upper portion. Note that the transistor 100 described in Embodiments 1 and 2 can be used as the transistor 3300.

One electrode of the capacitor 3400 is formed using the same material as a source electrode layer or a drain electrode layer of the transistor 3300, the other electrode of the capacitor 3400 is formed using the same material as a gate electrode layer of the transistor 3300, and a dielectric of the capacitor 3400 is formed using the same material as the second protective insulating layer 112 of the transistor 3300; thus, the capacitor 3400 can be formed at the same time as the transistor 3300.

Here, the first semiconductor material and the second semiconductor material preferably have different energy gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. In contrast, a transistor including an oxide semiconductor enables charge to be retained for a long time owing to its electrical characteristics, that is, the low off-state current.

Although both of the above transistors are n-channel transistors in the following description, it is needless to say that p-channel transistors can be used. The specific structure of the semiconductor device, such as a material used for the semiconductor device and the structure of the semiconductor device, needs not to be limited to that described here except for the use of the transistor described in Embodiment 1, which is formed using an oxide semiconductor for retaining data.

The transistor 3200 in FIG. 4A includes a channel formation region provided in a substrate 3000 containing a semiconductor material (such as crystalline silicon), impurity regions provided such that the channel formation region is provided therebetween, intermetallic compound regions in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

An element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

In the case where the transistor 3200 is formed using a crystalline silicon substrate, for example, the transistor 3200 can operate at high speed. Thus, when the transistor is used as a reading transistor, data can be read at high speed.

The transistor 3300 is provided over the insulating layer 3150, and the wiring electrically connected to the source electrode layer or the drain electrode layer of the transistor 3300 serves as the one electrode of the capacitor 3400. Further, the wiring is electrically connected to the gate electrode layer of the transistor 3200.

The transistor 3300 in FIG. 4A is a top-gate transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor storage device can be extremely low, which leads to a sufficient reduction in power consumption.

Further, an electrode 3250 is provided so as to overlap with the transistor 3300 with the insulating layer 3150 provided therebetween. By supplying an appropriate potential to the electrode 3250 serving as a second gate electrode, the threshold voltage of the transistor 3300 can be controlled. In addition, long-term reliability of the transistor 3300 can be improved. When the electrode operates with the same potential as that of the gate electrode of the transistor 3300, on-state current can be increased. Note that the electrode 3250 is not necessarily provided.

The transistor 3300 and the capacitor 3400 can be formed over the substrate over which the transistor 3200 is formed as illustrated in FIG. 4A, which enables the degree of the integration of the semiconductor device to be increased.

An example of a circuit configuration of the semiconductor device in FIG. 4A is illustrated in FIG. 4B.

In FIG. 4B, a first wiring 3001 is electrically connected to a source electrode layer of the transistor 3200. A second wiring 3002 is electrically connected to a drain electrode layer of the transistor 3200. A third wiring 3003 is electrically connected to one of the source electrode layer and the drain electrode layer of the transistor 3300. A fourth wiring 3004 is electrically connected to the gate electrode layer of the transistor 3300. The gate electrode layer of the transistor 3200 and the other of the source electrode layer and the drain electrode layer of the transistor 3300 are electrically connected to the one electrode of the capacitor 3400. A fifth wiring 3005 is electrically connected to the other electrode of the capacitor 3400. Note that a component corresponding to the electrode 3250 is not illustrated.

The semiconductor device in FIG. 4B utilizes a feature that the potential of the gate electrode layer of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode layer of the transistor 3200 and the capacitor 3400. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode layer of the transistor 3200 is retained (retaining).

Since the off-state current of the transistor 3300 is extremely low, the charge of the gate electrode layer of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode layer of the transistor 3200. This is because in general, in the case of using an n-channel transistor as the transistor 3200, an apparent threshold voltage $V_{th\_H}$ at the time when the high-level charge is given to the gate electrode layer of the transistor 3200 is lower than an apparent threshold voltage $V_{th\_L}$ at the time when the low-level charge is given to the gate electrode layer of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode layer of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($\leq V_{th\_L}$), the transistor 3200 remains off. Thus, the retained data can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode layer, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of times of rewriting, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

This embodiment can be combined as appropriate with any of the other embodiments in this specification.

Embodiment 4

The transistor described in Embodiments 1 and 2 can be used in a semiconductor device such as a display device, a storage device, a CPU, a digital signal processor (DSP), an LSI such as a custom LSI or a programmable logic device (PLD), a radio frequency identification (RF-ID), an inverter, or an image sensor. In this embodiment, electronic devices each including the semiconductor device are described.

Examples of the electronic devices having the semiconductor devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples of the electronic devices also include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (REV) that include both an internal-combustion engine and a motor, plug-in hybrid electric vehicles (PREY), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 5A to 5C.

Figure 5A:
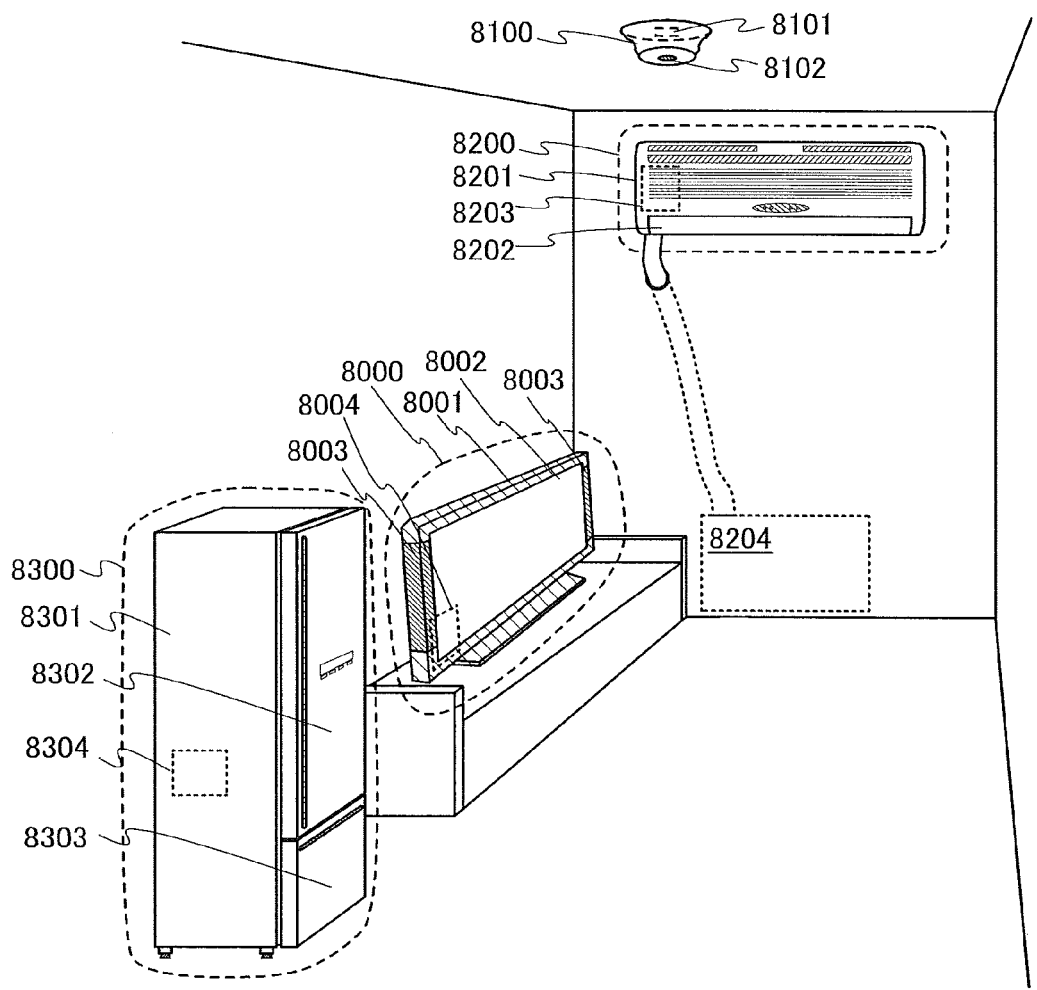
FIGS. 5A to 5C illustrate electronic devices to which semiconductor devices can be applied.
Figure 5B:
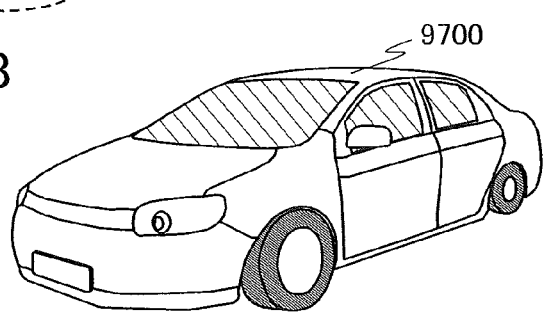
Figure 5C:
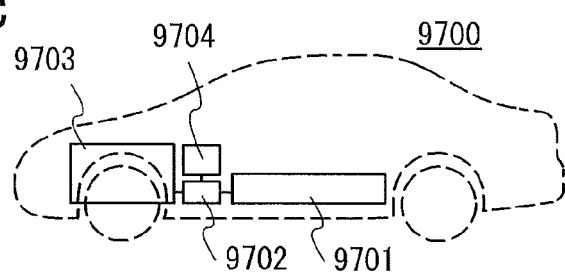

In a television set 8000 illustrated in FIG. 5A, a display portion 8002 is incorporated in a housing 8001. The display portion 8002 can display an image and a speaker portion 8003 can output sound. A storage device including the transistor of one embodiment of the present invention can be used for a driver circuit for operating the display portion 8002.

The television set 8000 may also include a CPU 8004 for performing information communication or a memory. For the memory, a storage device including the transistor of one embodiment of the present invention can be used.

An alarm device 8100 illustrated in FIG. 5A is a residential fire alarm, which includes a sensor portion 8102 for smoke or heat and a microcomputer 8101. Note that the microcomputer 8101 is an example of an electronic device that includes a storage device including the transistor of one embodiment of the present invention.

An air conditioner that includes an indoor unit 8200 and an outdoor unit 8204 illustrated in FIG. 5A is an example of an electronic device including the transistor, the storage device, or the like described in any of the above embodiments. Specifically, the indoor unit 8200 includes a housing 8201, an air outlet 8202, a storage device 8203, and the like. Although the storage device 8203 is provided in the indoor unit 8200 in FIG. 5A, the storage device 8203 may be provided in the outdoor unit 8204. Alternatively, the storage device 8203 may be provided in both the indoor unit 8200 and the outdoor unit 8204. By using any of the transistors of one embodiment of the present invention for the storage device in the air conditioner, a reduction in power consumption of the air conditioner can be achieved.

An electric refrigerator-freezer 8300 illustrated in FIG. 5A is an example of an electronic device including the transistor, the storage device, or the like described in any of the above embodiments. Specifically, the electric refrigerator-freezer 8300 includes a housing 8301, a door for a refrigerator 8302, a door for a freezer 8303, a storage device 8304, and the like. In FIG. 5A, the storage device 8304 is provided in the housing 8301. When the transistor of one embodiment of the present invention is used for the storage device 8304 of the electric refrigerator-freezer 8300, a reduction in power consumption of the electric refrigerator-freezer 8300 can be achieved.

FIGS. 5B and 5C illustrate an example of an electric vehicle that is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like that is not illustrated. When the transistor of one embodiment of the present invention is used for the ROM, RAM, and CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter that converts a direct current into an alternate current is also incorporated.

This application is based on Japanese Patent Application serial no. 2013-118730 filed with Japan Patent Office on Jun. 5, 2013, the entire contents of which are hereby incorporated by reference.

What is claimed is:

1. A semiconductor device comprising:
   a first oxide layer over a semiconductor substrate;
   an oxide semiconductor layer comprising a channel formation region over the first oxide layer;
   a second oxide layer over the oxide semiconductor layer and overlapping with the channel formation region;
   an insulating layer over the second oxide layer and overlapping with the channel formation region;
   a gate electrode layer over the insulating layer; and
   a low-resistance region on the oxide semiconductor layer,
   wherein a side surface of the first oxide layer and a side surface of the oxide semiconductor layer are substantially aligned with each other,
   wherein the second oxide layer is in contact with a top surface and the side surface of the oxide semiconductor layer,
   wherein the gate electrode layer surrounds the top surface and the side surface of the oxide semiconductor layer,
   wherein the low-resistance region has a lower resistance than the channel formation region,
   wherein the channel formation region has a composition different from a composition of the low-resistance region,
   wherein the first oxide layer, the oxide semiconductor layer, and the second oxide layer each comprises an oxide comprising In, an element M, and Zn,
   wherein the element M is any one of Al, Ti, Ga, Y, Zr, Sn, La, Ce, Nd, and Hf, and
   wherein an atomic ratio of the element M to In in each of the first and second oxide layers is higher than an atomic ratio of the element M to In in the oxide semiconductor layer.

2. The semiconductor device according to claim 1, further comprising a protective insulating layer over the gate electrode layer and the low-resistance region,
   wherein the low-resistance region comprises a first component included in the oxide semiconductor layer and a second component included in the protective insulating layer.

3. The semiconductor device according to claim 1, wherein the low-resistance region contains aluminum.

4. The semiconductor device according to claim 1, wherein the low-resistance region is formed in a self-aligned manner utilizing the gate electrode layer.

5. The semiconductor device according to claim 1, wherein a channel length of the channel formation region is less than or equal to 100 nm.

6. The semiconductor device according to claim 1, wherein a channel width of the channel formation region is less than or equal to 100 nm.

7. A semiconductor device comprising:
   a first protective insulating layer containing aluminum oxide over a semiconductor substrate;
   a first oxide layer over the first protective insulating layer;
   an oxide semiconductor layer comprising a channel formation region over the first oxide layer;
   a second oxide layer over the oxide semiconductor layer and overlapping with the channel formation region;
   an insulating layer over the second oxide layer and overlapping with the channel formation region;
   a gate electrode layer over the insulating layer;
   a low-resistance region on the oxide semiconductor layer; and
   a second protective insulating layer containing aluminum oxide over the gate electrode layer and the low-resistance region,
   wherein the low-resistance region has a lower resistance than the channel foimation region,
   wherein a side surface of the first oxide layer and a side surface of the oxide semiconductor layer are substantially aligned with each other,
   wherein the second oxide layer is in contact with a top surface and the side surface of the oxide semiconductor layer,
   wherein the gate electrode layer surrounds the top surface and the side surface of the oxide semiconductor layer,
   wherein the second protective insulating layer is in contact with a side surface of the low-resistance region and side surfaces of the second oxide layer,
   wherein the second protective insulating layer comprises a region in contact with the first protective insulating layer,
   wherein the first oxide layer, the oxide semiconductor layer, and the second oxide layer each comprises an oxide comprising In, an element M, and Zn,
   wherein the element M is any one of Al, Ti, Ga, Y, Zr, Sn, La, Ce, Nd, and Hf, and
   wherein an atomic ratio of the element M to In in each of the first and second oxide layers is higher than an atomic ratio of the element M to In in the oxide semiconductor layer.

8. The semiconductor device according to claim 7, wherein the low-resistance region contains aluminum.

9. The semiconductor, device according to claim 7, wherein the low-resistance region is formed in a self-aligned manner utilizing the gate electrode layer.

10. The semiconductor device according to claim 7, wherein a channel length of the channel formation region is less than or equal to 100 nm.

11. The semiconductor device according to claim 7, wherein a channel width of the channel formation region is less than or equal to 100 nm.

* * * * *

UNITED STATES PATENT AND TRADEMARK OFFICE
CERTIFICATE OF CORRECTION

PATENT NO. : 9,806,198 B2
APPLICATION NO. : 14/287749
DATED : October 31, 2017
INVENTOR(S) : Hideomi Suzawa It is certified that error appears in the above-identified patent and that said Letters Patent is hereby corrected as shown below:

In the Specification

Column 2, Line 67; Change "for" to --formation--.

Column 11, Line 65; Change "faulting" to --forming--.

Column 19, Line 62; Change "(REV)" to --(HEV)--.

Column 19, Line 63; Change "(PREY)," to --(PHEV),--.

In the Claims

Column 22, Line 21, Claim 7; Change "foimation" to --formation--.

Column 22, Line 47, Claim 9; Change "semiconductor, device" to --semiconductor device--.

Signed and Sealed this
Twentieth Day of February, 2018

Andrei Iancu
*Director of the United States Patent and Trademark Office*